US011455923B2

(12) United States Patent
Zhang et al.

(10) Patent No.: US 11,455,923 B2
(45) Date of Patent: Sep. 27, 2022

(54) ARRAY SUBSTRATE, DISPLAY MODULE, TESTING METHOD FOR DISPLAY MODULE, DISPLAY PANEL

(71) Applicants: HEFEI BOE DISPLAY TECHNOLOGY CO., LTD., Anhui (CN); BOE TECHNOLOGY GROUP CO., LTD., Beijing (CN)

(72) Inventors: Chunxu Zhang, Beijing (CN); Ke Dai, Beijing (CN); Zhonghou Wu, Beijing (CN); Peng Jiang, Beijing (CN); Yuntian Zhang, Beijing (CN); Yafei Deng, Beijing (CN)

(73) Assignees: HEFEI BOE DISPLAY TECHNOLOGY CO., LTD., Anhui (CN); BEIJING BOE TECHNOLOGY DEVELOPMENT CO., LTD., Beijing (CN)

(*) Notice: Subject to any disclaimer, the term of this patent is extended or adjusted under 35 U.S.C. 154(b) by 178 days.

(21) Appl. No.: 16/769,407

(22) PCT Filed: Nov. 12, 2019

(86) PCT No.: PCT/CN2019/117312
§ 371 (c)(1),
(2) Date: Jun. 3, 2020

(87) PCT Pub. No.: WO2020/151314
PCT Pub. Date: Jul. 30, 2020

(65) Prior Publication Data
US 2021/0225221 A1 Jul. 22, 2021

(30) Foreign Application Priority Data

Jan. 25, 2019 (CN) .......................... 201910073005.X

(51) Int. Cl.
G09G 3/00 (2006.01)
G02F 1/1362 (2006.01)
H01L 27/12 (2006.01)

(52) U.S. Cl.
CPC ....... *G09G 3/006* (2013.01); *G02F 1/136254* (2021.01); *G02F 1/136286* (2013.01);
(Continued)

(58) Field of Classification Search
None
See application file for complete search history.

(56) References Cited

U.S. PATENT DOCUMENTS 4,168,465 A * 9/1979 Prince ................ G01R 27/2605
324/690
9,171,869 B1 * 10/2015 Gao ...................... G02F 1/1368
(Continued)

FOREIGN PATENT DOCUMENTS

CN 101833910 A 9/2010
CN 103377961 A 10/2013
(Continued)

OTHER PUBLICATIONS

Office Action dated Mar. 23, 2020, issued in counterpart CN Application No. 201910073005.X, with English translation (35 pages).
(Continued)

Primary Examiner — Patrick N Edouard
Assistant Examiner — Peijie Shen
(74) Attorney, Agent, or Firm — WHDA, LLP

(57) ABSTRACT

The present disclosure generally relates to display technologies. An array substrate includes a plurality of repeating units arranged in a first direction, each repeating unit including a plurality of connection areas and a plurality of shared testing areas arranged in an alternating manner in a row
(Continued)

along the first direction. Each of the plurality of shared testing areas is between two adjacent connection areas and coupled to each of the two adjacent connection areas, and each of the plurality of shared testing areas includes a plurality of testing pads, a first portion of the plurality of testing pads being coupled to one of the two adjacent connection areas, a second portion of the plurality of testing pads being coupled to the other one of the two adjacent connection areas.

14 Claims, 4 Drawing Sheets

(52) U.S. Cl.
CPC ... *H01L 27/124* (2013.01); *G09G 2300/0413* (2013.01); *G09G 2300/0426* (2013.01); *G09G 2330/12* (2013.01)

(56) References Cited

U.S. PATENT DOCUMENTS

| | | | |
|---|---|---|---|
| 9,276,019 B2 | 3/2016 | Yamada et al. | |
| 9,658,284 B2 | 5/2017 | Hu et al. | |
| 10,176,737 B2 | 1/2019 | Zhou | |
| 10,254,602 B2 | 4/2019 | Cao et al. | |
| 2006/0001792 A1* | 1/2006 | Choi | H01L 27/3244 257/E27.111 |
| 2007/0165176 A1 | 7/2007 | Yang et al. | |
| 2009/0231255 A1* | 9/2009 | Tanimoto | G02F 1/136286 345/87 |
| 2010/0127258 A1 | 5/2010 | Kang et al. | |
| 2015/0037914 A1* | 2/2015 | Takahashi | H01L 22/14 438/15 |
| 2015/0170982 A1* | 6/2015 | Jeong | G09G 3/006 257/48 |
| 2018/0095313 A1* | 4/2018 | Cao | G02F 1/1345 |
| 2018/0307067 A1* | 10/2018 | Hwang | G02F 1/1309 |
| 2019/0064239 A1* | 2/2019 | Lee | G01R 27/205 |
| 2019/0113788 A1* | 4/2019 | Matsumoto | G02F 1/13 |
| 2020/0074955 A1* | 3/2020 | Fujikawa | G09G 3/3688 |
| 2021/0110744 A1* | 4/2021 | Hu | G09G 3/006 |

FOREIGN PATENT DOCUMENTS

| | | |
|---|---|---|
| CN | 103608856 A | 2/2014 |
| CN | 104505371 A | 4/2015 |
| CN | 104656292 A | 5/2015 |
| CN | 104715702 A | 6/2015 |
| CN | 105607316 A | 5/2016 |
| CN | 107154232 A | 9/2017 |
| CN | 109658855 A | 4/2019 |
| KR | 20060042304 A | 5/2006 |

OTHER PUBLICATIONS

International Search Report dated Feb. 6, 2020, issued in counterpart Application No. PCT/CN2019/117312 (11 pages).
Office Action dated Oct. 19, 2020, issued in counterpart CN Application No. 201910073005.X, with English translation (9 pages).

* cited by examiner

ARRAY SUBSTRATE, DISPLAY MODULE, TESTING METHOD FOR DISPLAY MODULE, DISPLAY PANEL

CROSS-REFERENCE TO RELATED APPLICATIONS

This application claims benefit of the filing date of Chinese Patent Application No. 201910073005.X filed on Jan. 25, 2019, the disclosure of which is hereby incorporated in its entirety by reference.

TECHNICAL FIELD

The present disclosure generally relates to display technologies, and in particular, to an array substrate, a display apparatus, a testing method for the display apparatus, and a display panel.

BACKGROUND

A liquid crystal display device includes an array substrate and a counter substrate (e.g., a color filter substrate) disposed opposite to each other, and a liquid crystal layer disposed between the array substrate and the counter substrate. In the liquid crystal display device, orientation of liquid crystal molecules is controlled by applying of voltages to a common electrode and a pixel electrode, and in turn, light rays are controlled.

BRIEF SUMMARY

An embodiment of the present disclosure is an array substrate. The array substrate may comprise a plurality of repeating units arranged in a first direction, each repeating unit comprising a plurality of connection areas and a plurality of shared testing areas arranged in an alternating manner in a row along the first direction. Each of the plurality of shared testing areas may be between two adjacent connection areas and coupled to each of the two adjacent connection areas. Each of the plurality of shared testing areas may comprise a plurality of testing pads, a first portion of the plurality of testing pads being coupled to one of the two adjacent connection areas, a second portion of the plurality of testing pads being coupled to the other one of the two adjacent connection areas.

In at least some embodiments, the plurality of connection areas and the plurality of shared testing areas may be arranged in the alternating manner so that two adjacent connection areas are separated by one shared testing area.

In at least some embodiments, at least one of the plurality of testing pads may be a dummy pad.

In at least some embodiments, each of the plurality of shared testing areas may comprise a same number of testing pads.

In at least some embodiments, each repeating unit may comprise a terminal testing area that is provided at an end of the row and that is coupled to a single adjacent connection area.

In at least some embodiments, each of the plurality of connection areas may comprise a plurality of connection terminals, at least a portion of the plurality of connection terminals being coupled to corresponding testing pads in one of the plurality of shared testing areas.

In at least some embodiments, connection terminals coupled to the terminal testing area may be insulated from connection terminals coupled to the plurality of shared testing areas.

In at least some embodiments, the array substrate may further comprise a plurality of leads coupled to at least a portion of the plurality of connection terminals.

In at least some embodiments, the plurality of leads may extend in a second direction that intersects with the first direction.

In at least some embodiments, at least a first portion of the leads may be gate drive lines. In at least some embodiments, only connection terminals coupled to the terminal testing area may be coupled to the gate drive lines.

In at least some embodiments, the connection terminals coupled to the plurality of shared testing areas may be insulated from the gate drive lines.

In at least some embodiments, at least a second portion of the leads may be signal lines, common electrode lines, or a combination of both.

In at least some embodiments, the connection terminals coupled to the plurality of shared testing areas may be coupled to the second portion of the leads.

In at least some embodiments, the array substrate may further comprise at least one short circuit.

In at least some embodiments, at least a portion of the plurality of connection areas may be coupled to each other via the at least one short circuit.

In at least some embodiments, at least a portion of the plurality of shared testing areas may be coupled to each other via the at least one short circuit.

In at least some embodiments, at least a portion of the testing pads may be coupled to corresponding connection terminals via the at least one short circuit.

In at least some embodiments, each repeating unit may comprise four connection areas and a total of four shared testing areas and terminal testing areas.

In at least some embodiments, each of the plurality of connection areas may be configured to be coupled to a drive unit.

In at least some embodiments, each of the plurality of shared test areas may be configured to be coupled to a probe unit.

Another embodiment of the present disclosure is a display module. The display module may comprise an array substrate as described above, and a counter substrate arranged to be opposite to the array substrate. In at least some embodiments, the plurality of repeating units may be provided in a portion of the array substrate that does not overlap with the counter substrate.

Another embodiment of the present disclosure is a testing method for testing a display module as described above. The method may comprise coupling a plurality of probe units to the plurality of shared testing areas on the array substrate, and transmitting testing signals to the plurality of shared testing areas. In at least some embodiments, the number of probe units is half the number of connection areas on the array substrate.

Another embodiment of the present disclosure is a display panel. The display panel may comprise a display module as described above, and at least one drive unit coupled to the connection areas on the array substrate.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the present disclosure are apparent from the following detailed description taken in conjunction with the accompanying drawings in which:

Figure 1:
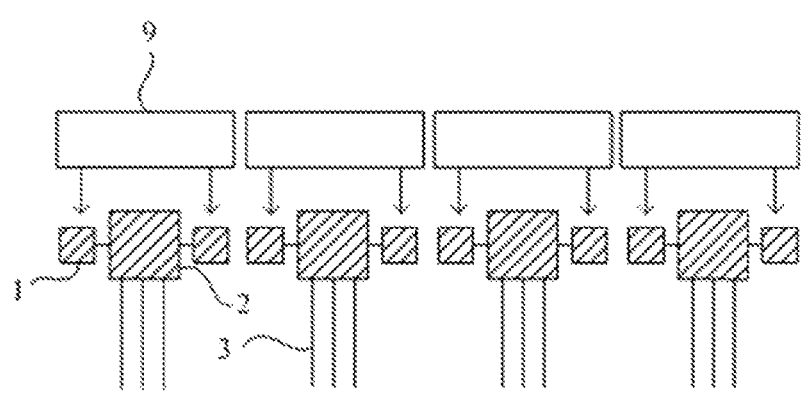
FIG. 1 shows a schematic diagram of an array substrate according to related technologies.

The various features of the drawings are not to scale as the illustrations are for clarity in facilitating one skilled in the art in understanding the invention in conjunction with the detailed description.

DETAILED DESCRIPTION

Next, the embodiments of the present disclosure will be described clearly and concretely in conjunction with the accompanying drawings, which are described briefly above. The subject matter of the present disclosure is described with specificity to meet statutory requirements. However, the description itself is not intended to limit the scope of this disclosure. Rather, the inventors contemplate that the claimed subject matter might also be embodied in other ways, to include different steps or elements similar to the ones described in this document, in conjunction with other present or future technologies.

While the present technology has been described in connection with the embodiments of the various figures, it is to be understood that other similar embodiments may be used or modifications and additions may be made to the described embodiments for performing the same function of the present technology without deviating therefrom. Therefore, the present technology should not be limited to any single embodiment, but rather should be construed in breadth and scope in accordance with the appended claims. In addition, all other embodiments obtained by one of ordinary skill in the art based on embodiments described in this document are considered to be within the scope of this disclosure.

A liquid crystal display device includes an array substrate and a counter substrate (e.g., a color filter substrate) disposed opposite to each other, and a liquid crystal layer disposed between the array substrate and the counter substrate. In the liquid crystal display device, orientation of liquid crystal molecules is controlled by applying of voltages to a common electrode and a pixel electrode, and in turn, light rays are controlled.

A production line of a liquid crystal display panel generally includes the process of array, color filter (CF), cell, and module. The array process is intended to form the array substrate, including mainly formation of metal layer signal lines and pixel capacitance cells on the array substrate. The CF process includes mainly the formation of a black matrix (BM) layer; red, green, and blue (RGB) layers; a transparent conductive layer, and the like on the CF substrate. The cell process is intended to assemble the array substrate and the CF substrate, for example, by bonding the two substrates together with an adhesive, to form a display apparatus. The process includes mainly forming an alignment film by printing, aligning of the alignment film, dropping liquid crystal, curing of the adhesive, and the like. The module process includes mainly assembling the display apparatus with a polarizing filter, a PCB driving circuit, and a backlight source, to form the final display panel.

During the cell process, before the array substrate and the CF substrate are bonded, an array test to the array substrate is required, and after the array substrate and the CF substrate are bonded, a cell test is also required. During the array test or the cell test, it is required to provide corresponding signal input pads including an array test signal input pad (AT Pad) and a cell test signal input pad (CT Pad) on the glass substrate. The cell test may be performed before bonding and after cutting.

More particularly, as shown in FIG. 1, after the array substrate and the color filter substrate are bonded, a cell test may be performed before coupling the chip-on-film (COF) structure and other drive units to various connection areas 2 on the array substrate to form the display panel.

Each connection area 2 is provided with a plurality of connection terminals. Each connection terminal is connected to a lead 3 (for example, a data line, a common electrode line). A portion of the plurality of connection terminals (for example, connection terminals connected to data lines) are connected to each other via a short circuit, and release an electro-static discharge (ESD) during the production process (after which the short circuit is shorted). A testing area 1 is provided at opposite ends of each connection area 2, for example, as shown in FIG. 1. Each testing area 1 is provided with a testing pad that is electrically coupled to the connection terminal of the connection area 2. During testing, a plurality of probe units (PU) 9 are coupled to the corresponding testing areas 1. For example, each probe unit 9 may be coupled to the two testing areas 1 provided at opposite ends of a connection area 2. The pin in each probe unit 9 is in contact with the testing pad in each testing area 1, and is configured to transmit testing signals to the lead 3 through the testing pad.

The field of display technologies is trending toward ever higher resolution. Products with high PPI (pixels per inch) require high pixel density. In order to accommodate the high pixel density, one option is shorten the distance between neighboring connection areas 2. This, however, leaves insufficient space to accommodate the testing areas 1, and affects the ability to properly conduct testing.

It is therefore desirable to provide an array substrate to at least partially alleviate one or more problems set forth above, and to solve other problems in the art.

Figure 2:
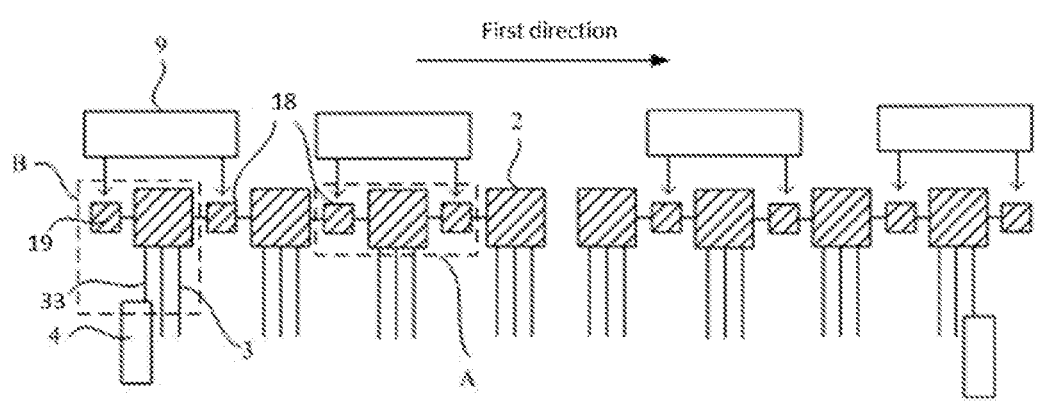
FIG. 2 shows a schematic diagram of an array substrate according to an embodiment of the present disclosure.
Figure 3:
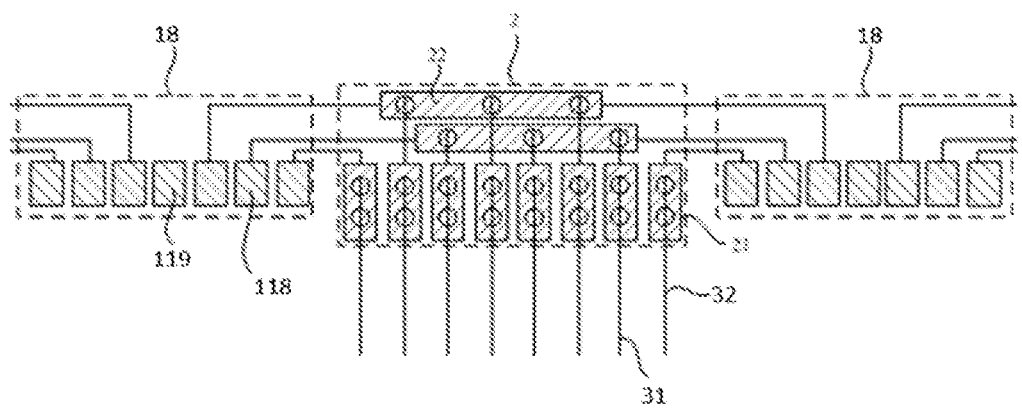
FIG. 3 shows a schematic diagram of the area "A" in an array substrate according to the embodiment illustrated in FIG. 2.
Figure 4:
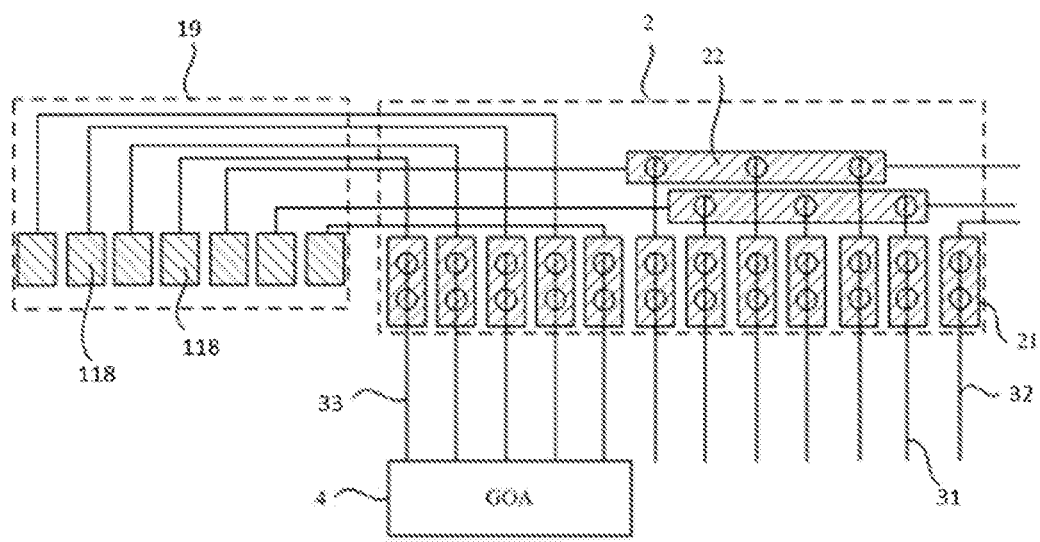
FIG. 4 shows a schematic diagram of the area "B" in an array substrate according to the embodiment illustrated in FIG. 2.

FIG. 2 shows a schematic diagram of an array substrate according to an embodiment of the present disclosure. FIG. 3 shows a schematic diagram of the area "A" in an array substrate according to the embodiment illustrated in FIG. 2. FIG. 4 shows a schematic diagram of the area "B" in an array substrate according to the embodiment illustrated in FIG. 2.

As shown in FIGS. 2-4, the present disclosure provides an array substrate. The array substrate comprises a plurality of repeating units arranged in a first direction, each repeating unit comprising a plurality of connection areas 2 and a plurality of shared testing areas 18 arranged in an alternating manner in a row along the first direction. The plurality of connection areas 2 are configured to be coupled to a drive unit (not shown). The plurality of shared testing areas 18 are configured to be coupled to a plurality of probe units 9. Each of the plurality of shared testing areas 18 is between two adjacent connection areas 2. More particularly, the plurality of connection areas 2 and the plurality of shared testing areas 18 are arranged in the alternating manner so that two adjacent connection areas 2 are separated by one shared testing area 18. Each of the plurality of shared testing areas 18 is coupled to each of the two adjacent connection areas 2. Each of the plurality of shared testing areas 18 comprises a plurality of testing pads, a first portion of the plurality of testing pads being coupled to one of the two adjacent connection areas 2, a second portion of the plurality of testing pads being coupled to the other one of the two adjacent connection areas 2.

A plurality of connection terminals 21 are provided in each of the plurality of connection areas 2. Each of the plurality of connection terminals 21 is coupled to a lead 3, for example, as shown in FIG. 2. A plurality of testing pads are provided in each of the plurality of shared testing areas 18 and terminal testing area 19. The numbers and arrangements of testing pads in any two of the plurality of connection areas 2 are the same.

Each of the plurality of connection areas 2 comprises a plurality of connection terminals 21, at least a portion of the plurality of connection terminals 21 being coupled to corresponding testing pads in one of the plurality of shared testing areas 18. In at least some embodiments, connection terminals 21 coupled to the terminal testing area 19 are insulated from connection terminals 21 coupled to the plurality of shared testing areas 18.

The array substrate further comprises at least one terminal testing area 19. A terminal testing area 19 is provided at an end of the row and that is coupled to a single adjacent connection area 2, for example, as shown in FIG. 2. Each of the plurality of testing pads in the terminal testing area 19 is electrically coupled to one of the plurality of connection terminals 21 in the corresponding connection area 2, for example, as shown in FIG. 4.

A shared testing area 18 is coupled to two or more of connection areas 2, for example, as shown in FIG. 2. In some embodiments, each shared testing area 18 is coupled to two connection areas 2. The plurality of testing pads in the shared testing area 18 are coupled to the plurality of connection terminals 21 in the two or more corresponding connection areas 2.

In some embodiments, the plurality of connection areas 2 are provided in a peripheral region of the array substrate. The plurality of connection areas 2 are configured to be coupled to a drive unit, including, for example, a driver chip-on-film (COF). The array substrate further comprises a plurality of leads 3 coupled to at least a portion of the plurality of connection terminals 21 of the connection area 2. The plurality of leads 3 extend in a second direction that intersects with the first direction, for example, as shown in FIGS. 2 to 4. Each of the plurality of connection terminals 21 in a connection area 2 is coupled to a lead 3. The lead 3 may be a signal line 31, a common electrode line 32, a gate drive line 33, and the like. In at least some embodiments, at least a first portion of the leads 3 are gate drive lines. In at least some embodiments, only connection terminals 21 coupled to the terminal testing area 19 are coupled to the gate drive lines. In at least some embodiments, the connection terminals 21 coupled to the plurality of shared testing areas 18 are insulated from the gate drive lines. In at least some embodiments, at least a second portion of the leads 3 are signal lines, common electrode lines, or a combination of both. In at least some embodiments, the connection terminals 21 coupled to the plurality of shared testing areas 18 are coupled to the second portion of the leads 3. The connection terminals 21 may be coupled to the leads 3 by any appropriate means known to a person of ordinary skill in the art, including, but not limited to, the use of a through-hole. Coupling a connection terminal 21 to a lead 3 configures the connection terminal 21 to transmit the drive signals through the lead 3, so as to drive display.

A plurality of shared testing areas 18 and terminal testing areas 19 are provided on the array substrate. A plurality of testing pads are provided in each shared testing area 18 or terminal testing area 19. When a testing area 18, 19 is coupled to a probe unit 9, at least a portion of the testing pad are in contact with a corresponding pin in the probe unit 9. The testing pad is configured to receive testing signals from the probe unit 9, and transmit the testing signals to the lead 3 via the connection terminal 21, so as to drive testing.

In some embodiments, the array substrate comprises a plurality of probe units 9, and the plurality of probe units 9 have the same configurations. For example, the probe units 9 may each have the same number of pins, and may be arranged in the same manner. The number and arrangement of the testing pads in each testing area 18, 19 are also the same and uniform.

In some embodiments, different connection areas 2 are configured to transmit different types of signals. Different numbers of signal lines may also be provided in different connection areas 2, for example, as shown in FIGS. 3 and 4. In some embodiments, GOA signals are transmitted through the first and last connection areas 2 in a repeating unit, and the other connection areas 2 are configured to transmit data and/or common signal. It is understood that the connection areas 2 may be configured to transmit any suitable signals depending on need and/or specific implementation of the array substrate. As such, since each testing area 1 corresponds to a connection area 2, different testing areas 18, 19 may also require different numbers of testing pads. In such embodiments, one or more dummy pads 119 may need to be provided in some testing areas 18, 19 to ensure that the testing areas 18, 19 all have the same number of testing pads. However, such a configuration may increase the required surface area of the testing areas 18, 19, and an array substrate, and in particular, an array substrate for products with high PP, may not have sufficient space to the testing areas 18, 19.

As shown in FIG. 2, on the array substrate according to the present disclosure, the plurality of testing areas 18, 19 comprise at least one terminal testing area 19 and at least one shared testing area 18. Each terminal testing area 19 corresponds to only one of the plurality of connection areas 2, for example, as shown in FIG. 2. That is, the terminal testing area 19 is provided at an end of the row and that is coupled to a single adjacent connection area 2. Each of the plurality of testing pads in the terminal testing area 19 is electrically coupled to one of the plurality of connection terminals 21 in the corresponding connection area 2. A shared testing area 18 corresponds to two or more of the plurality of connection areas 2, for example, as shown in FIG. 2. The plurality of testing pads in the shared testing area 18 are coupled to the plurality of connection terminals 21 in the two or more corresponding connection areas 2. In other words, each terminal testing area 19 is configured to power only one connection area 2. The number of testing pads in a terminal testing area 19 is equal to the number of signals required by the corresponding connection area 2. Each shared testing area 18 is configured to power two or more connection areas 2. The maximum number of testing pads in a shared testing area 18 is equal to the sum of the numbers of signals required by the corresponding two or more connection areas 2.

In some embodiments, connection terminals 21 coupled to the terminal testing area 19 are insulated from connection terminals 21 coupled to the plurality of shared testing areas 18.

A shared testing area 18 corresponds to two or more of the plurality of connection areas 2, for example, as shown in FIGS. 2 to 4. That is, a shared testing area 18 is between two adjacent connection areas 2 and coupled to each of the two adjacent connection areas 2. A shared testing area 18 is shared by the two or more connection areas 2. Each shared testing area 18 comprises a plurality of testing pads. A portion of the testing pads are active testing pads 118, which are coupled to the connection areas 2 that correspond to the shared testing area 18. More particularly, each active testing pad 118 is coupled to a connection terminal 21 in a corresponding connection area 2, for example, as shown in FIG. 3. However, as shown in FIG. 3, there may be testing pads that are not coupled to a connection area 2. These uncoupled testing pads are dummy pads 119. In some embodiments, a shared testing area 18 may comprise at least one active testing pad 118 and at least one dummy pad 119, for example, as shown in FIG. 3. The number of dummy pads 119 should be minimal, and in some embodiments, there are no dummy pads 119. Minimizing the number of dummy pads 119 may help reduce the total surface area occupied by the testing areas 18, 19. This in turn may allow the testing areas 18, 19 to be implemented in products with higher PPI, and increase the versatility of the testing areas 18, 19. Further, the present disclosure makes it possible to configure the testing areas 18, 19, for example, by adjusting the location and/or arrangements of the testing areas 18, 19, and/or by "sharing" the testing areas 18, 19, so that the same probe units 9 may be used for products having different PPI.

In some embodiments, each shared testing area 18 is coupled to two connection areas 2. More particularly, for purpose of facilitating wiring and the like, it may be advantageous for two connection areas 2 to share a shared testing area 18.

In some embodiments, each of the plurality of testing pads in each terminal testing area 19 is an active testing pad 118, for example, as shown in FIG. 4. Each active testing pad 118 is coupled to a connection terminal 21 in the corresponding connection area 2, for example, as shown in FIG. 4.

In some embodiments, a plurality of connection terminals 21 in at least a portion of the connection areas 2 are electrically coupled to each other via a short circuit 22, for example, as shown in FIGS. 3 and 4. In some embodiments, at least a portion of the testing pads are electrically coupled to a corresponding plurality of connection terminals 21 via a short circuit 22, for example, as shown in FIGS. 3 and 4. In at least some embodiments, at least a portion of the plurality of shared testing areas 18 are coupled to each other via the at least one short circuit.

In some embodiments, when connection terminals 21 are electrically coupled to each other via a short circuit 22, the leads 3 to which those connection terminals 21 are coupled are signal lines 31.

As shown in FIGS. 3 and 4, a portion of the plurality of connection terminals 21 are connected to each other via a short circuit 22, and release an electro-static discharge (ESD) during the production process (after which the short circuit is shorted). The connection terminals 21 may be coupled to each other by any appropriate means known to a person of ordinary skill in the art, including, but not limited to, the use of a through-hole. In some embodiments, the testing pads 118 in a testing area 18, 19 may also be coupled to the plurality of connection terminals 21 via a short circuit 22, and are configured to transmit testing signals to the lead 3 via the connection terminal 21, for example, in order to drive testing. The configurations of the present disclosure make it possible to reduce the number of testing pads and simplify product structure.

A connection area 2 is often coupled to a large number of signal lines 31, and the same testing signals may be transmitted through the signal lines 31. As such, connection terminals 21 coupled to different signal lines 31 are joined together via the short circuit 22. In some embodiments, for example, as shown in FIGS. 3 and 4, the array substrate comprises two short circuits 22. One of the short circuits 22 is configured to couple odd-numbered signal lines 31, and the other one of the short circuits 22 is configured to couple even-numbered signal lines 31. In order to avoid interferences with the display effects, the short circuit 22 may be shorted after testing.

In some embodiments, the array substrate may further comprise a gate driving circuit 4. The leads 3 may include at least one gate drive line 33 configured to provide the drive signals to the gate driving circuit 4.

At least a portion of the connection terminals 21 coupled to a terminal testing area 19 are coupled to gate drive lines 33, for example, as shown in FIGS. 2 and 4.

Each of the connection terminals 21 coupled to shared testing area 18 is insulated from the gate drive line 33, for example, as shown in FIGS. 3 and 4.

In some embodiments, the connection terminals 21 are insulated from each other. The connection terminals 21 coupled to the shared testing area 18 do not overlap with the connection terminals 21 coupled to the terminal testing area 19. As such, each of the connection terminals 21 coupled to the shared testing area 18 may be insulated from the connection terminals 21 coupled to the terminal testing area 19.

In some embodiments, the gate driving circuit 4 may be implemented on the array substrate as a gate driver on array (GOA). Using the GOA technique may simplify the production process, and reduce production costs. The gate driving circuit 4 comprises a plurality of cascaded shift registers. Each shift register is coupled to a gate line, and the gate driving circuit 4 is controlled by a plurality of gate drive lines 33 (for example, a switch line, an initialization signal line, a clock line, and the line). As such, a portion of the connection areas 2 comprises connection terminals 21 that are configured to transmit drive signals to the gate drive lines 33. The number of connection terminals 21 in those connection areas 2 is therefore higher, and those connection areas 2 are coupled to a terminal testing area 19. It is understood that the terminal testing area 19 may also be configured to provide drive signals for other components.

In some embodiments, the plurality of connection areas 2 and the plurality of testing areas 18, 19 are arranged in a row in the first direction. Shared testing areas 18 are provided in the spaces between adjacent connection areas 2. The dimensions of the space between adjacent connection areas 2 are not particularly limited, and may be dimensioned in accordance with the specific implementation of the array substrate. For example, the distance separating adjacent connection areas 2 may depend on the dimensions and/or resolution of the display panel incorporating the array substrate. In some embodiments, the number of connection areas 2 on the array substrate is in the range of from 12 to 24. In some embodiments, adjacent connection areas 2 may be separated by a distance in the range of from 19 mm to 80 mm. In some embodiments, in the space between a pair of adjacent connection areas 2, at most one shared testing area 18 is provided. The shared testing area 18 is coupled to the two connection areas 2 on either side of the shared testing area 18. In some embodiments, the array substrate comprises a plurality of repeating units, each repeating unit comprising four connection areas 2 and a total of four shared testing areas 18 and terminal testing areas 19.

As shown in FIG. 2, the plurality of connection areas 2 and the plurality of testing areas 18, 19 are arranged in a row in the first direction along a periphery of the array substrate. In some embodiments, the connection areas 2 and the testing areas 18, 19 are arranged in a horizontal or longitudinal direction of the array substrate. The present disclosure makes it possible to minimize the footprint of the connection areas 2 and the testing areas 18, 19. In some embodiments, at most one shared testing area 18 is provided between a pair of adjacent connection areas 2. The shared testing area 18 is coupled to the two connection areas 2 on either side of the shared testing area 18.

In some embodiments, the array substrate comprises at most two terminal testing areas 19. The two terminal testing areas 19 are provided at opposite ends of the row of connection areas 2 and testing areas 18, 19. For example, if the connection areas 2 and the testing areas 18, 19 are arranged in a row along the longitudinal direction of the array substrate, the terminal test areas 19 may be provided at the longitudinal ends of the row.

In some embodiments, the number of connection areas 2 on the array substrate is a multiple of 4. In some embodiments, in each row of connection areas and testing areas, a shared testing area 18 is provided between two adjacent connection areas 2, except for between the two connection areas 2 in the middle of the row. For example, as shown in FIG. 2, the array substrate may comprise eight (8) connection areas. Further, as shown in FIG. 2, a shared testing area 18 is provided between two adjacent connection areas 2, except for between the two connection areas 2 in the middle of the row of connection areas 2 and testing areas 1. A terminal testing area 19 is provided at either end of the row.

In some embodiments, the total number of test areas 18, 19 on the array substrate is an even number. This configuration may facilitate the testing with probe units 9.

In some embodiments, in at least a portion of the connection areas 2, at least a portion of the connection terminals 21 are simultaneously coupled to testing pads 118 in the two testing areas 18, 19 on either side of their respective connection areas 2. In some embodiments, in at least a portion of the connection areas 2, at least a portion of the connection terminals 21 are coupled to testing pads 118 in only one of the two testing areas 18, 19 on either side of their respective connection areas. In some embodiments, in at least a portion of the connection areas 2, at least a first portion of the connection terminals 21 are simultaneously coupled to testing pads 118 in the two testing areas 18, 19 on either side of their respective connection area 2, and at least a second portion of the connection terminals 21 are coupled only to testing pads 118 in one of the two testing areas 18, 19.

As shown in FIGS. 3 and 4, at least a portion of the connection terminals 21 (for example, connection terminals 21 coupled to a short circuit 22) in a connection area 2 are coupled simultaneously to testing pads 118 in the two testing areas 18, 19 on either side of the connection area 2. This configuration may facilitate the supply of power. In some embodiments, portions of the connection terminals 21 in a connection area 2 may be coupled to testing pads 118 in one or the other of the two testing areas 18, 19 on either side of the connection area 2.

The present disclosure also provides a display module.

The display module may comprise an array substrate as described above, and a counter substrate (for example, a color filter substrate) that is positioned to be opposite to the array substrate.

The array substrate and the counter substrate are assembled into a display module. The display module does not include drive units, and the short circuit 22 has not been shorted.

In some embodiments, the plurality of repeating units are provided in a portion of the array substrate that does not overlap with the counter substrate. The connection areas 2 and the testing areas 18, 19 may be provided in the non-overlapping portion of the array substrate. This configuration may facilitate coupling to the drive units, probe units 9, and the like.

The present disclosure also provides a testing method for the display module.

The testing method may comprise coupling a probe unit 9 to each of the shared testing areas 18 and/or terminal testing area 19 on the array substrate. The probe units 9 may each have the same structure. Each probe unit 9 may comprise at least one probe. Each probe comprises a plurality of pins. The number of the pins in a probe corresponds to the number of testing pads in the corresponding testing area 18, 19. The pins in the probe are arranged in a complementary manner to the arrangement of the testing pads in the corresponding shared testing area 18. Each probe corresponds to one testing area 18, 19, and each pin is in contact with one testing pad.

The testing method may further comprise transmitting testing signals to the testing pads through the pins.

After the display module is assembled, the connection areas 2 and the testing areas 18, 19 on the array substrate are exposed, so that the probe units 9 may be coupled to the testing areas 18, 19, and the pins in the probe units 9 may be coupled to the testing pads. Testing signals are transmitted from the pins to the testing pads, then to the connection terminals 21, to ultimately reach the leads 3. The present disclosure thus effects testing of the display module.

In some embodiments, the number of connection areas 2 on the array substrate is a multiple of four (4). Each probe unit 9 is provided with two probes, and each of the two probes corresponds to one of the two testing areas 1 on either side of a connection area 2. As shown in FIG. 2, a probe unit 9 may comprise two probes that are spaced apart. The two probes may be coupled simultaneously to the two testing areas 1 on either side of a connection area 2. Further, since the number of connection areas 2 on the array substrate is a multiple of four (4), the number of probe units 9 required to connect all the testing areas 1 on the array substrate is half the number of connection areas 2 on the array substrate.

The present disclosure also provides a display panel.

The display panel may comprise a display module. The display module may be as described above. The display panel may further comprise at least one drive unit that is coupled to a connection area 2 on the array substrate. The drive unit may be a driver integrated circuit or a driver chip-on-film (COF).

After the drive unit is coupled to the connection area on the array substrate, the short circuit is shorted, so as to obtain a functioning display panel. A display panel according to the present disclosure may be integrated into any device configured to provide a display function, including, but not limited to, a liquid crystal display (LCD) device, an organic light emitting diode (OLED) display device, a mobile phone, a tablet, a television, a computer, a display, a notebook computer, a digital photo frame, a navigation system, and any other products or components that provide a display function.

References in the present disclosure made to the term "some embodiment," "some embodiments," and "exemplary embodiments," "example," and "specific example," or "some examples" and the like are intended to refer that specific features and structures, materials or characteristics described in connection with the embodiment or example that are included in at least some embodiments or example of the present disclosure. The schematic expression of the terms does not necessarily refer to the same embodiment or example. Moreover, the specific features, structures, materials or characteristics described may be included in any suitable manner in any one or more embodiments or examples. In addition, for a person of ordinary skill in the art, the disclosure relates to the scope of the present disclosure, and the technical scheme is not limited to the specific combination of the technical features, and also should cover other technical schemes which are formed by combining the technical features or the equivalent features of the technical features without departing from the inventive concept. What is more, the terms "first" and "second" are for illustration purposes only and are not to be construed as indicating or implying relative importance or implied reference to the quantity of indicated technical features. Thus, features defined by the terms "first" and "second" may explicitly or implicitly include one or more of the features. In the description of the present disclosure, the meaning of "plural" is two or more unless otherwise specifically and specifically defined.

The principle and the embodiment of the present disclosures are set forth in the specification. The description of the embodiments of the present disclosure is only used to help understand the embodiments of the present disclosure and the core idea thereof. Meanwhile, for a person of ordinary skill in the art, the disclosure relates to the scope of the disclosure, and the technical scheme is not limited to the specific combination of the technical features, and also should covered other technical schemes which are formed by combining the technical features or the equivalent features of the technical features without departing from the inventive concept. For example, technical scheme may be obtained by replacing the features described above as disclosed in this disclosure (but not limited to) with similar features.

What is claimed is:

1. An array substrate, comprising:
   a plurality of repeating units arranged in a first direction, each repeating unit comprising a plurality of connection areas and a plurality of shared testing areas arranged in an alternating manner in a row along the first direction,
   wherein:
   each of the plurality of shared testing areas is between two adjacent connection areas and coupled to each of the two adjacent connection areas, and
   each of the plurality of connection areas comprises a plurality of testing pads, a first portion of the plurality of testing pads being coupled to one of the two adjacent connection areas, a second portion of the plurality of testing pads being coupled to the other one of the two adjacent connection areas;
   at least one repeating unit comprises a terminal testing area that is provided at an end of the row and that is coupled to a single adjacent connection area;
   each of the plurality of connection areas comprises a plurality of connection terminals, at least a portion of the plurality of connection terminals being coupled to corresponding testing pads in one of the plurality of shared testing areas;
   connection terminals coupled to the terminal testing area are insulated from connection terminals coupled to the plurality of shared testing areas;
   the array substrate further comprises a plurality of leads coupled to at least a portion of the plurality of connection terminals, and the plurality of leads extend in a second direction that intersects with the first direction;
   at least a first portion of the leads are gate drive lines, and only connection terminals coupled to the terminal testing area are coupled to the gate drive lines; and
   the terminal testing area, the plurality of shared testing areas, and the plurality of connection areas are arranged in the row along the first direction.

2. The array substrate according to claim 1, wherein:
   the array substrate further comprises at least one short circuit, and
   at least a portion of the plurality of connection areas are coupled to each other via the at least one short circuit.

3. The array substrate according to claim 2, wherein at least a portion of the plurality of shared testing areas are coupled to each other via the at least one short circuit.

4. The array substrate according to claim 2, wherein at least a portion of the testing pads are coupled to corresponding connection terminals via the at least one short circuit.

5. A display module, comprising:
   the array substrate according to claim 1, and
   a counter substrate arranged to be opposite to the array substrate,
   wherein the plurality of repeating units are provided in a portion of the array substrate that does not overlap with the counter substrate.

6. A testing method for testing the display module according to claim 5, the method comprising:
   coupling a plurality of probe units to the plurality of shared testing areas on the array substrate, and
   transmitting testing signals to the plurality of shared testing areas,
   wherein the number of probe units is half the number of connection areas on the array substrate.

7. A display panel, comprising:
   the display module according to claim 5, and
   at least one drive unit coupled to the connection areas on the array substrate.

8. The array substrate according to claim 1, wherein the plurality of connection areas and the plurality of shared testing areas are arranged in the alternating manner so that two adjacent connection areas are separated by one shared testing area.

9. The array substrate according to claim 1, wherein at least one of the plurality of testing pads is a dummy pad.

10. The array substrate according to claim 1, wherein each of the plurality of shared testing areas comprises a same number of testing pads.

11. The array substrate according to claim 1, wherein the connection terminals coupled to the plurality of shared testing areas are insulated from the gate drive lines.

12. The array substrate according to claim 1, wherein:
    at least a second portion of the leads are signal lines, common electrode lines, or a combination of both, and
    the connection terminals coupled to the plurality of shared testing areas are coupled to the second portion of the leads.

13. The array substrate according to claim 1, where each repeating unit comprises four connection areas and a total of four shared testing areas and terminal testing areas.

14. The array substrate according to claim 1, wherein:
each of the plurality of connection areas is configured to be coupled to a drive unit, and
each of the plurality of shared test areas is configured to be coupled to a probe unit.

\* \* \* \* \*